(12) United States Patent
Hench et al.

(10) Patent No.: US 8,381,140 B2
(45) Date of Patent: Feb. 19, 2013

(54) WIDE PROCESS RANGE LIBRARY FOR METROLOGY

(75) Inventors: John J. Hench, San Jose, CA (US); Wen Jin, Fremont, CA (US); Junwei Bao, Los Altos, CA (US)

(73) Assignees: Tokyo Electron Limited, Tokyo (JP); KLA—Tencor Corporation, Milpitas, CA (US)

( * ) Notice: Subject to any disclaimer, the term of this patent is extended or adjusted under 35 U.S.C. 154(b) by 28 days.

(21) Appl. No.: 13/025,654

(22) Filed: Feb. 11, 2011

(65) Prior Publication Data
US 2012/0210289 A1  Aug. 16, 2012

(51) Int. Cl.
*G06F 17/50* (2006.01)
(52) U.S. Cl. ............................................ 716/52; 716/54
(58) Field of Classification Search ................ 716/52, 716/54
See application file for complete search history.

(56) References Cited

U.S. PATENT DOCUMENTS

| | | | |
|---|---|---|---|
| 7,421,414 B2 | 9/2008 | Liu et al. | |
| 2003/0187602 A1* | 10/2003 | Bao et al. | 702/94 |
| 2007/0232045 A1* | 10/2007 | Lally et al. | 438/597 |
| 2008/0077352 A1* | 3/2008 | Willis et al. | 702/155 |
| 2009/0094001 A1* | 4/2009 | Vuong et al. | 702/189 |

OTHER PUBLICATIONS

Sanguineti, Marcello, "Universal Approximation by Ridge Computational Models and Neural Networks: A Survey," The Open Applied Mathematics Journal, vol. 2, 2008, pp. 31-58.
Pinkus, Allan, "Approximation Theory of the MLP Model in Neural Networks," Acta Numerica (1999), pp. 143-195.

* cited by examiner

*Primary Examiner* — Nghia Doan
*Assistant Examiner* — Mohammed Alam
(74) *Attorney, Agent, or Firm* — Blakely Sokoloff Taylor Zafman LLP

(57) ABSTRACT

Methods of generating wide process range libraries for metrology are described. For example, a method includes generating a first library having a first process range for a first parameter. A second library is generated having a second process range for the first parameter. The second process range is overlapping with the first process range. The second library is stitched to the first library to generate a third library having a third process range for the first parameter. The third process range is wider than each of the first and second process ranges.

26 Claims, 8 Drawing Sheets

FLOWCHART 300

WIDE PROCESS RANGE LIBRARY FOR METROLOGY

TECHNICAL FIELD

Embodiments of the present invention are in the field of optical metrology, and, more particularly, relate to methods of generating wide process range libraries for metrology.

BACKGROUND

For the past several years, a rigorous couple wave approach (RCWA) and similar algorithms have been widely used for the study and design of diffraction structures. In the RCWA approach, the profiles of periodic structures are approximated by a given number of sufficiently thin planar grating slabs. Specifically, RCWA involves three main steps, namely, the Fourier expansion of the field inside the grating, calculation of the eigenvalues and eigenvectors of a constant coefficient matrix that characterizes the diffracted signal, and solution of a linear system deduced from the boundary matching conditions. RCWA divides the problem into three distinct spatial regions: 1) the ambient region supporting the incident plane wave field and a summation over all reflected diffracted orders, 2) the grating structure and underlying non-patterned layers in which the wave field is treated as a superposition of modes associated with each diffracted order, and 3) the substrate containing the transmitted wave field.

The accuracy of the RCWA solution depends, in part, on the number of terms retained in the space-harmonic expansion of the wave fields, with conservation of energy being satisfied in general. The number of terms retained is a function of the number of diffraction orders considered during the calculations. Efficient generation of a simulated diffraction signal for a given hypothetical profile involves selection of the optimal set of diffraction orders at each wavelength for both transverse-magnetic (TM) and/or transverse-electric (TE) components of the diffraction signal. Mathematically, the more diffraction orders selected, the more accurate the simulations. However, the higher the number of diffraction orders, the more computation is required for calculating the simulated diffraction signal. Moreover, the computation time is a nonlinear function of the number of orders used.

SUMMARY

Embodiments of the present invention include methods of generating wide process range libraries for metrology of repeating structures on a semiconductor substrate or wafer.

In an embodiment, a method includes generating a first library having a first process range for a first parameter. The method also includes generating a second library having a second process range for the first parameter, the second process range overlapping with the first process range. The method also includes stitching the second library to the first library to generate a third library having a third process range for the first parameter, the third process range wider than each of the first and second process ranges.

In an embodiment, a method includes generating a first library having a plurality of process ranges, each process range corresponding to a different one of a plurality of parameters. The method also includes generating a second library having a process range for a first of the plurality of parameters, the process range of the second library different from but overlapping with the process range of the first library for the first of the plurality of parameters. The method also includes stitching the second library to the first library. The method also includes repeating the generating and stitching for one or more additional parameters of the plurality of parameters to provide a final library.

In another embodiment, a machine-accessible storage medium has instructions stored thereon which cause a data processing system to perform a method of generating a wide process range library for metrology. The method includes generating a first library having a first process range for a first parameter. The method also includes generating a second library having a second process range for the first parameter, the second process range overlapping with the first process range. The method also includes stitching the second library to the first library to generate a third library having a third process range for the first parameter, the third process range wider than each of the first and second process ranges.

In another embodiment, a machine-accessible storage medium has instructions stored thereon which cause a data processing system to perform a method of generating a wide process range library for metrology. The method includes generating a first library having a plurality of process ranges, each process range corresponding to a different one of a plurality of parameters. The method also includes generating a second library having a process range for a first of the plurality of parameters, the process range of the second library different from but overlapping with the process range of the first library for the first of the plurality of parameters. The method also includes stitching the second library to the first library. The method also includes repeating the generating and stitching for one or more additional parameters of the plurality of parameters to provide a final library.

DETAILED DESCRIPTION

Figure 1:
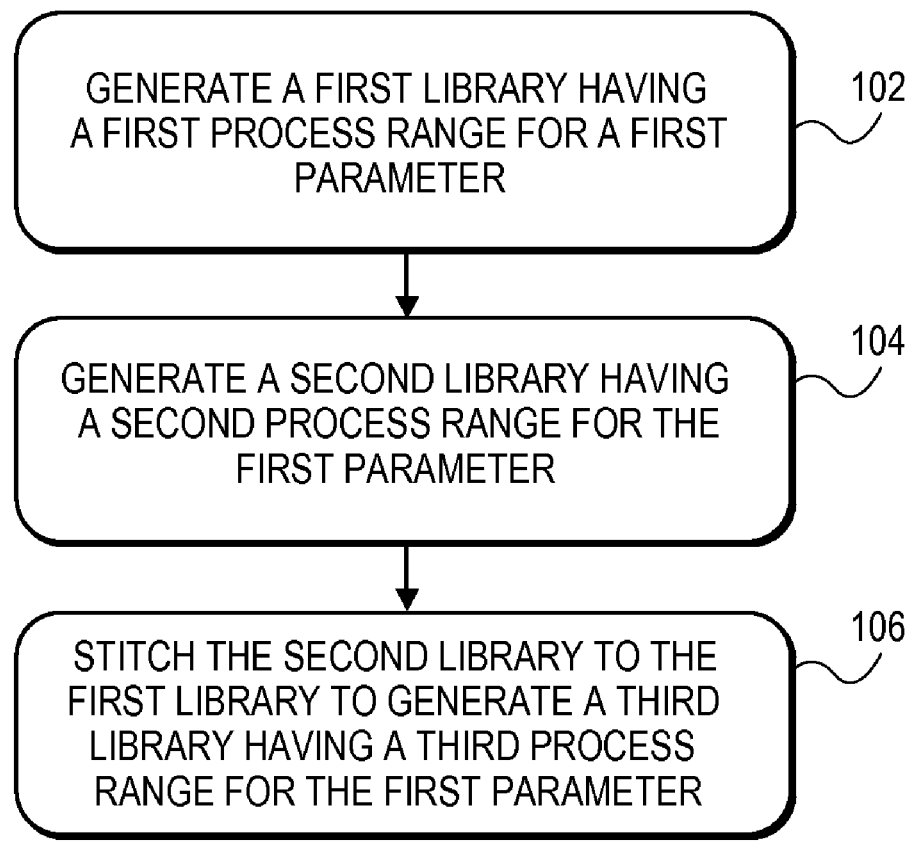
FIG. 1 depicts a flowchart representing an exemplary series of operations for generating a wide process range library for metrology, in accordance with an embodiment of the present invention.

Methods of generating wide process range libraries for metrology are described herein. In the following description, numerous specific details are set forth, such as examples of asymmetric properties of structures, in order to provide a thorough understanding of embodiments of the present invention. It will be apparent to one skilled in the art that embodiments of the present invention may be practiced without these specific details. In other instances, well-known processing steps, such as fabricating stacks of patterned material layers, are not described in detail in order to not unnecessarily obscure embodiments of the present invention. Furthermore, it is to be understood that the various embodiments shown in the figures are illustrative representations and are not necessarily drawn to scale.

In recent optical critical-dimension (OCD) applications, a wide process range may be desired, or there may be a range shift during the life of the process. Also, a user may even desire to build a library to cover two process ranges. Very often, users build a good library with small process range(s) for a first use case, and aims to keep that library as a base. In accordance with an embodiment of the present invention, additional libraries are appended to the base library to cover wider process ranges later, in a process described herein as library stitching.

In an example of one or more embodiment of the present invention, a good library (Library A) is established with a relatively small process range. A user may desire to extend the range for several parameters to cover the future process, but would like to keep the Library A for the previous range since the results are good and are applicable for future measurement inside that range. Accordingly, in an embodiment, a new library is built iteratively. The iterations may involve starting with a base or main library and stitching additional libraries to the base library or to a most recent new library formed there from. The final library may provide a good library suitable to achieve user's goal. In one such embodiment, each iteration only extends one dimension of a range in the starting library.

As an example, in an embodiment, a process includes (a) identifying a good library (Library A) which may be multi-range if desired, (b) building another good library (Library B) as a new project in a same workbook (the range of Library B may be equal in all dimensions except the one in which the extension is desired—for that dimension, overlap with Library A is provided by an estimated overlap amount such as 2 nanometers), (c) extending the other size to the desired amount, where the overlap amount is estimated from the derivative of the combined function in the overlap region and also the library error estimation of library A and library B, (d) setting up another library C folder and stitching Libraries A and B together to provide Library C that is a multi-range library that consists of all of the sub-libraries in A and B, (e) setting A=C and going back to (a) to extending another dimension to build another Library B and stitching to form another Library C, and (f) repeating (e) to finish extending all the dimensions desired.

Overall, the processes and methodologies described herein may provide an innovative way to build a good library for large process ranges. Libraries may be built iteratively by extending one dimension range each time, then stitching the libraries together to provide a library with large library range. Determination of an overlap region and how to stitch two such libraries is described in detail below. The approaches described may make possible the building of a large range library with good accuracy.

The stitching library method described herein may aid a user to build a good library to cover large process range through an iterative approach. The methodologies are flexible with respect to extending dimensions, both in consideration of an individual user's needs and desired timing. For example, a user may retain a previous library for a previous range where the library has provided consistent results. Then, any new library used is delivered with a large, yet accurate, range.

The approached described in detail herein may be distinguished from conventional partitioning where a library may be broken into fragments, the fragments then added together again. Instead, in an embodiment, a library is built-up from a base or main library stitched to additional, overlapping libraries. The present approach may address difficulties in initially building a single library to cover a wide range. The overall response from the multi-libraries stitched together may provide a weighted summation of the sub-libraries with non-negligible contribution. Thus, the adding of libraries may be performed in a functionally smooth manner.

FIG. 1 depicts a flowchart 100 representing an exemplary series of operations for generating a wide process range library for metrology, in accordance with an embodiment of the present invention.

Referring to operation 102 of flowchart 100, a first library is generated, the first library having a first process range for a first parameter. Then, referring to operation 104 of flowchart 100, a second library is generated, the second library having a second process range for the first parameter. The second process range overlaps with the first process range. Then, referring to operation 106 of flowchart 100, the second library is stitched to the first library to generate a third library having a third process range for the first parameter. The third process range is wider than each of the first and second process ranges.

In accordance with an embodiment of the present invention, for simplicity, the stitching can be viewed as combining two overlapping libraries. For example, two library functions are determined, $f_1(x)$ and $f_2(x)$, which take a given scalar parameter variable, x, to a spectra signal for given ranges of the parameter value. For the stitching of such overlapping libraries, there is a range for which the spectral signal is given by a convex combination of the two functions, as provided in eq. 1:

$$f(x) = c(x)f_1(x) + (1-c(x))f_2(x). \qquad (1)$$

The function, c (x), used to mix the two library function is based on the logistic sigmoid, as provided in eq. 2:

$$c(x) = \left(1 + e^{\frac{\kappa(x-x_0)}{\rho}}\right)^{-1}, \qquad (2)$$

where κ=13.82, ρ is the overlap region length, and where $x_0$ is the middle of the overlap region. A similar approach can be applied to sub-libraries. For example, in an embodiment, referring again to flowchart 100, the first library has one or more sub-libraries, the second library has one or more sub-libraries, and the third library includes all of the sub-libraries of the first and second libraries.

In accordance with an embodiment of the present invention, referring again to flowchart 100, the first library has one or more additional parameters. The second library also has the one or more additional parameters. The process ranges for the one or more additional parameters are the same in both the first and second libraries. In one such embodiment, the first and second libraries differ only by the first and second process ranges. However, in an alternative embodiment, the process ranges in the first and second libraries differ in one or more additional parameters and do not even overlap. For these parameters, the resulting library includes a disconnected range.

In an embodiment, the first and second libraries overlap by an overlap amount. In one such embodiment, the method described in association with flowchart 100 further includes an operation of determining the overlap amount based on the derivative of a combined function in the region where the second process range is overlapping with the first process range. The determining is also based on a library error estimation for each of the first and second libraries.

Regarding an overlap region determination, the overlapping amount is based on the characteristics of each of the functions of the two regions and the characteristics of the combined function. In an example, one method by which the overlap region can be determined, in an embodiment is based on the derivative of combined functions, as provided in eq. 3:

$$\nabla f = (c \nabla f_1 + (1-c) \nabla f_2) + \nabla c (f_1 - f_2). \quad (2)$$

The middle of the overlap range may be imposed such that the contribution to the derivative due to the combining function, $c(x)|_{x=x_0}$, is smaller than the derivative of the interpolating functions. In other words, the first term of eq. 3 will dominate the second. Using the logistic function defined in eq. 2, eq. 4 may be provided:

$$\bar{J}_f > |\nabla c(x_0)||f_1(x_0) - f_2(x_0)| > \left|\frac{\kappa}{4\rho}\right||f_1(x_0) - f_2(x_0)| \quad (4)$$

where $$\bar{J}_f = \frac{1}{2}(\nabla f_1(x_0) + \nabla f_2(x_0)).$$

Solving eq. 4 for the overlap region yields eq. 5:

$$\rho > \frac{\kappa}{4|\bar{J}_f|}|f_1(x_0) - f_2(x_0)| \quad (5)$$

Since the norm of the error in the middle of the overlap region is not available before the library is computed, the desired signal error, $E_f$, is substituted for the libraries in general. This approach provides eq. 6:

$$\rho > \frac{\kappa E_f}{4|\bar{J}_f|} = \frac{3.455 E_f}{|\bar{J}_f|}. \quad (6)$$

It is to be understood that the above represents only one possible example. For example, there may be a host of sigmoid functions that may be used for the mixing function. In one embodiment, the cosine squasher sigmoid function is used. While equation (1) above would remain the same no matter what sigmoid function one used, equations (2, 4, 5, 6) would change accordingly. Examples of workable sigmoid functions may be found in the articles, "Universal Approximation by Ridge Computational Models and Neural Networks: A Survey" (M. Sanguineti, The Open Applied Mathematics Journal, 2008, 31-58), and "Approximation theory of the MLP model in neural networks" (A. Pinkus, Acta Numerica (1999), pp. 143-195, Cambridge University Press).

In accordance with an embodiment of the present invention, referring again to flowchart 100, method further includes an operation of generating a fourth library having a fourth process range for the first parameter. The fourth process range overlaps with the third process range. Additionally, an operation of stitching the fourth library to the third library to generate a fifth library having a fifth process range for the first parameter is performed. The fifth process range is wider than each of the third and fourth process ranges.

It is to be understood that stitching need not be limited to a single parameter at a given time. Instead, more than one parameter may be modified in a single stitching process. For example, in an embodiment, referring again to flowchart 100, the first library also has a fourth process range for a second parameter, the second library also has a fifth process range for the second parameter, the fifth process range overlapping with the fourth process range, and the third library also has a sixth process range for the second parameter, the sixth process range wider than each of the fourth and fifth process ranges.

Figure 2A:
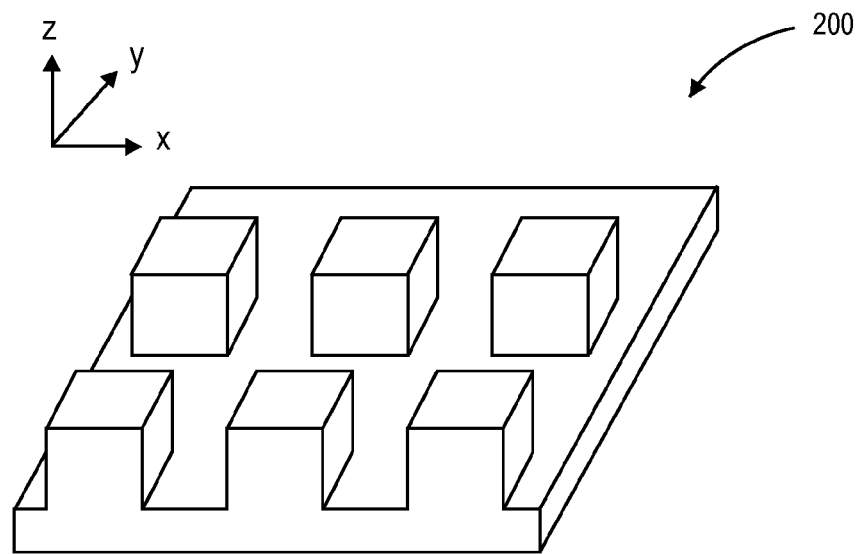
FIG. 2A depicts a periodic grating having a profile that varies in the x-y plane, in accordance with an embodiment of the present invention.

The first parameter described in association with flowchart 100 may be, in an embodiment, of an individual feature of a two-dimensional or three-dimensional grating structure. The term "three-dimensional grating structure" is used herein to refer to a structure having an x-y profile that varies in two dimensions in addition to a depth in the z-direction. For example, FIG. 2A depicts a periodic grating 200 having a profile that varies in the x-y plane, in accordance with an embodiment of the present invention. The profile of the periodic grating varies in the z-direction as a function of the x-y profile.

Figure 2B:
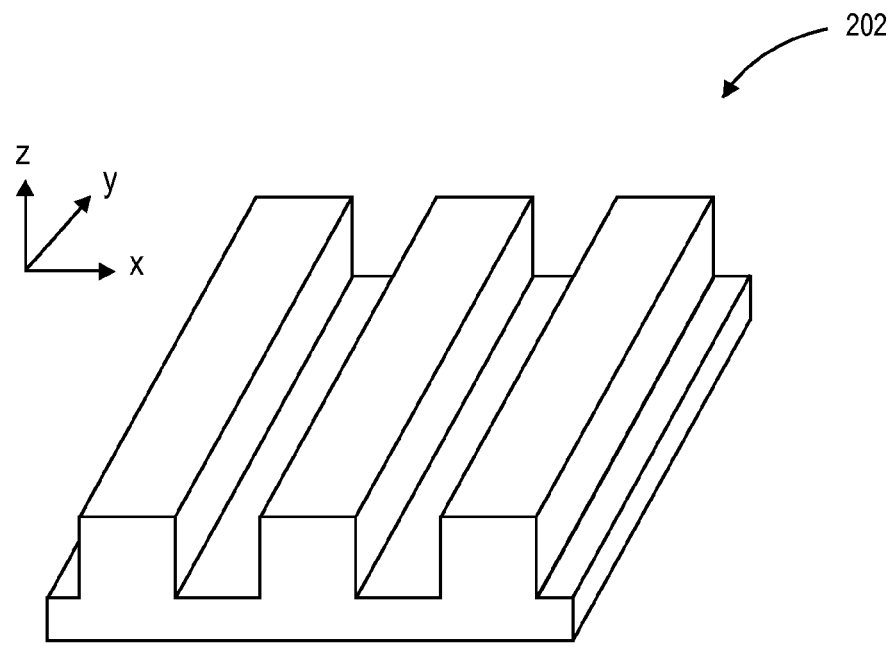
FIG. 2B depicts a periodic grating having a profile that varies in the x-direction but not in the y-direction, in accordance with an embodiment of the present invention.

The term "two-dimensional grating structure" is used herein to refer to a structure having an x-y profile that varies in only one dimension in addition to a depth in the z-direction. For example, FIG. 2B depicts a periodic grating 202 having a profile that varies in the x-direction but not in the y-direction, in accordance with an embodiment of the present invention. The profile of the periodic grating varies in the z-direction as a function of the x profile. It is to be understood that the lack of variation in the y-direction for a two-dimensional structure need not be infinite, but any deviations in the pattern are considered long range, e.g., any deviations from the pattern in the y-direction are spaced substantially further apart than the deviations in the pattern in the x-direction.

In one such embodiment where the individual feature is of a two-dimensional or three-dimensional grating structure, the first parameter is one such as, but not limited to, width, height, length, top corner rounding, bottom footing, or sidewall angle of the individual feature.

In an embodiment, referring again to flowchart 100, the third library includes a simulated spectrum, and the method described in association with flowchart 100 further includes an operation of comparing the simulated spectrum to a sample spectrum. In one embodiment, the simulated spectrum obtained from a set of spatial harmonics orders. In one embodiment, the sample spectrum is collected from a structure such as, but not limited to, a physical reference sample or a physical production sample. In an embodiment, the comparison is performed by using a regression calculation. In one embodiment, one or more non-differential signals are used simultaneously in the calculation. The one or more non-differential signals may be one such as, but not limited to, azimuth angles, angles of incidence, polarizer/analyzer angles, or additional measurement targets.

Figure 3:
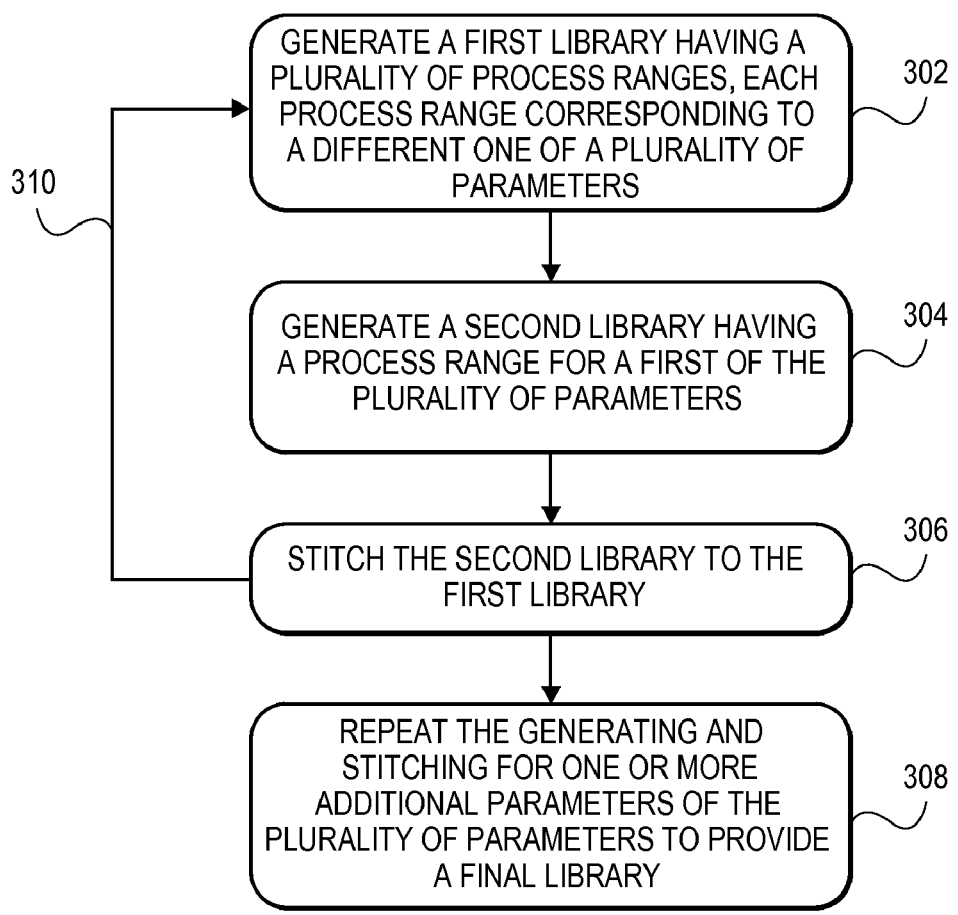
FIG. 3 depicts a flowchart representing an exemplary series of operations for generating a wide process range library for metrology, in accordance with an embodiment of the present invention.

In an aspect of the present invention, library stitching may be used to expand the range of more than one parameter in the original library. For example, FIG. 3 depicts a flowchart 300 representing another exemplary series of operations for generating a wide process range library for metrology, in accordance with an embodiment of the present invention.

Referring to operation 302 of flowchart 300, a first library is generated having a plurality of process ranges. Each process range corresponds to a different one of a plurality of parameters. Referring to operation 304 of flowchart 300, a second library is generated having a process range for a first of the plurality of parameters. The process range of the second library is different from, but overlaps with, the process range of the first library for the first of the plurality of parameters. Referring to operation 306 of flowchart 300, the second library is stitched to the first library, as described above.

Referring to operation 308 of flowchart 300, the generating and stitching is repeated, e.g., via cycle 310, for one or more additional parameters of the plurality of parameters (different from the first of the plurality of parameters) to provide a final library. In accordance with an embodiment of the present invention, each of the process ranges of the final library is wider than or equal to the corresponding process range of the plurality of process ranges of the first library. In an embodiment, the final library includes a simulated spectrum. In one such embodiment, the method of flowchart 300 further includes an operation of comparing the simulated spectrum to a sample spectrum, as described above.

Regarding the use of stitched libraries as provided from the methods of flowcharts 100 and 300, in an embodiment, such a method includes altering parameters of a process tool based on the agreement or non-agreement with simulated parameters in the stitched library. Altering the parameters of the process tool may be performed by using a technique such as, but not limited to, a feedback technique, a feed-forward technique, and an in situ control technique. In an embodiment, the stitched library can be used to more accurately set up a device structure profile and geometry in a CD metrology tool recipe. In an embodiment, the stitched library is used as a part of CD metrology tool validation, diagnostic and characterization.

Figure 4A:
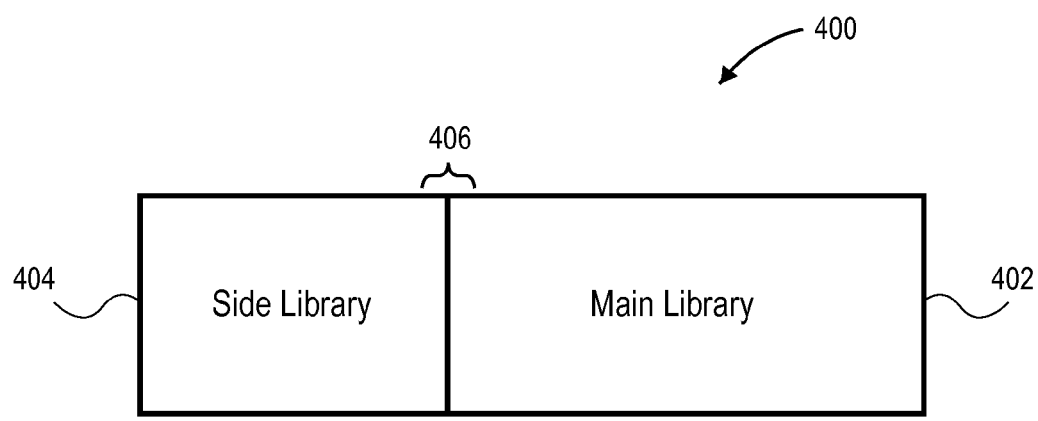
FIG. 4A illustrates a block diagram representing a main library overlapping with and stitched to a side library, in accordance with an embodiment of the present invention.

A side library extension process is described as an example implementation of one or more of the above described embodiments of methodologies contemplated herein. FIG. 4A illustrates a block diagram representing a main library overlapping with and stitched to a side library, in accordance with an embodiment of the present invention.

Referring to FIG. 4A a library 400 is composed of a side library 404 stitched to an existing library 402, inheriting ranges from the main library in all dimensions except that which is being extended. As described above, the range in the side library 404 of the dimension not inherited is not identical to, but does overlap with, the corresponding range in the main library 402. Thus, although depicted as a resulting boundary line between the original range and the new extended range, there is actually an overlap region 406 between the two libraries, as described above.

In an implementation, after pressing an "Extend" button, a GUI window pops up with the ranges of the main library for all dimensions. A user can change one value of a parameter range in one dimension, after which all other parameter ranges are fixed. A new project is created with the same library settings, except with the ranges modified to correspond to the side library. The side library may be created automatically. In one specific embodiment, three independent libraries make it easy to test for measurement shifts near the border of the side library and the main library.

In another implementation, a Matlab prototype exists which takes two libraries (A & B) and concatenates them into a third. Library B is a copy of A, with one range changed, becoming the side library. Library C is the extended library. This prototype produces working libraries. The ratio of the number of samples for the original library versus the side library is the ratio of the volumes of the library range. The mechanism for concatenating the libraries may be similar to a library partition mechanism, where slightly overlapped sub-libraries are combined to form one main library. The overlap is automatically inherited from the main library, or if necessary re-computed. Although the process of extending a library may be repeated indefinitely, in a specific embodiment, the maximum repetition is 4 times. In another specific embodiment, the maximum repetition is provided by eq. 7:

$$\text{Maximum repetition of library extensions} = 2 \cdot N_{DOF}, \quad (7)$$

where $N_{DOF}$ is the number of degrees of freedom, and is synonymous with the number of ranges in the library.

In another implementation, a side library extension process is performed using the exemplary operations below. The example starts with a simple 2 degree of freedom model of a film stack. In a first operation, a base library is created, e.g., a good test is a simple 2 film project, with a coarse library setting. Next, the base library is created using coarse settings. Once this operation is completed, the library may be extended. In a next operation, a side library is created. The user may have the option to extend a range of a parameter. In a next operation, the base and side libraries are concatenated. In a next operation, the libraries are combined and, after combining, a new project may be created.

In an embodiment, all new libraries have the overlap length automatically computed for each parameter range and stored, even if the library is not partitioned. This approach greatly simplifies the library extension algorithm. Also, in an embodiment, there is at least some consistency between the library settings and the settings in the GUI. In an embodiment, a side library is not allowed if the settings have been changed. The side libraries may be designated in some fashion as side libraries, allowing it/them to be concatenated only with the base library from which it was generated. Later, sufficient information in the library files may be present to reconstruct all of the settings in the GUI.

Figure 4B:
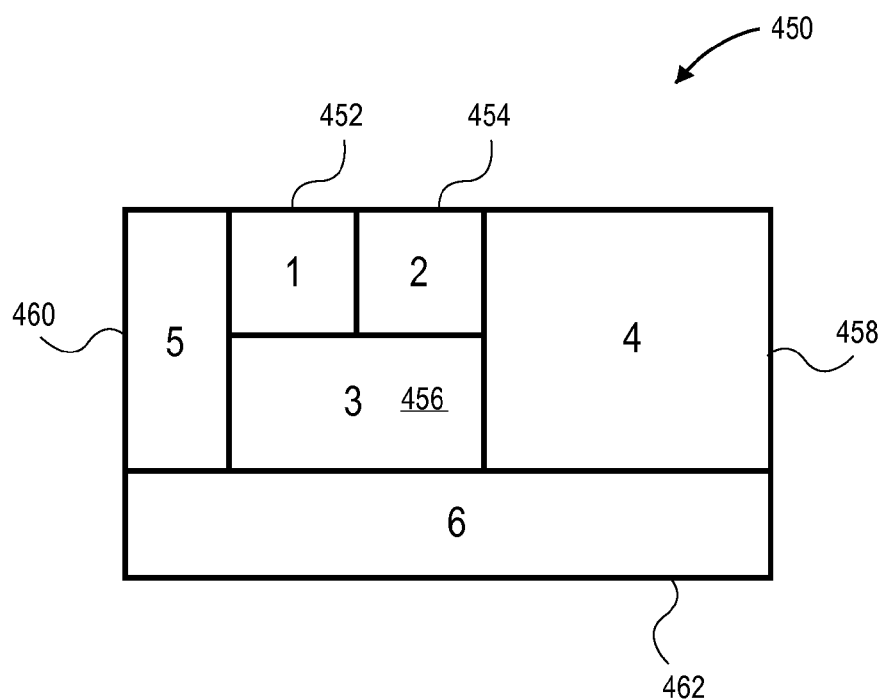
FIG. 4B illustrates a block diagram representing a growing main library overlapping with and stitched to a plurality of side libraries, in accordance with an embodiment of the present invention.

A side library extension process may be performed in multiple iterations. FIG. 4B illustrates a block diagram representing a growing main library overlapping with and stitched to a plurality of side libraries, in accordance with an embodiment of the present invention.

Referring to FIG. 4B a library 450 is composed of a base library 452. Side libraries are stitched to base library 452 (or the new library resulting from a previous iteration). For example, in order, side library 454 is built overlapping in one dimension of base library 452, inheriting ranges from base library 452 in all dimensions except that which is being extended. Then, side library 456 is built overlapping in one dimension of the new library (1+2), inheriting ranges from the new library (1+2) in all dimensions except that which is being extended. Then, side library 458 is built overlapping in one dimension of the new library (1+2+3), inheriting ranges from the new library (1+2+3) in all dimensions except that which is being extended. Then, side library 460 is built overlapping in one dimension of the new library (1+2+3+4), inheriting ranges from the new library (1+2+3+4) in all dimensions except that which is being extended. Finally, side library 462 (6) is built overlapping in one dimension of the new library (1+2+3+4+5), inheriting ranges from the new library (1+2+3+4+5) in all dimensions except that which is being extended As described above, the range in each side library (454, 456, 458, 460 or 462) of the dimension not inherited is not identical to, but does overlap with, the corresponding range in the previously iterated library. Thus, although depicted as a resulting boundary line between the original range and the new extended range, there is actually an overlap region between each adjoining library shown, as described above.

Stitched libraries described herein may include simulated spectra based on orders of a diffraction signal. The orders may be simulated as being derived from a periodic structure. The zeroth order represents a diffracted signal at an angle equal to the angle of incidence of a hypothetical incident beam, with respect to the normal N of the periodic structure. Higher diffraction orders are designated as +1, +2, +3, −1, −2, −3, etc. Other orders known as evanescent orders may also be considered. In accordance with an embodiment of the present invention, a simulated diffraction signal is generated for use in optical metrology. For example, profile parameters, such as structural sidewall angles, may be modeled for use in optical metrology. Optical properties of materials, such as index of refraction and coefficient of extinction, (n & k) in wafer structures may also be modeled for use in optical metrology.

As described above, use of a stitched library may include comparing a simulated spectrum to a sample spectrum. In one embodiment, a set of diffraction orders is simulated to represent diffraction signals generated by an ellipsometric optical metrology system from a two- or three-dimensional grating structure. Such an optical metrology system is described below in association with FIG. 7. However, it is to be understood that the same concepts and principles equally apply to the other optical metrology systems, such as reflectometric systems. The diffraction signals represented may account for features of the two- or three-dimensional grating structure such as, but not limited to, profile, dimensions or material composition.

Figure 5:
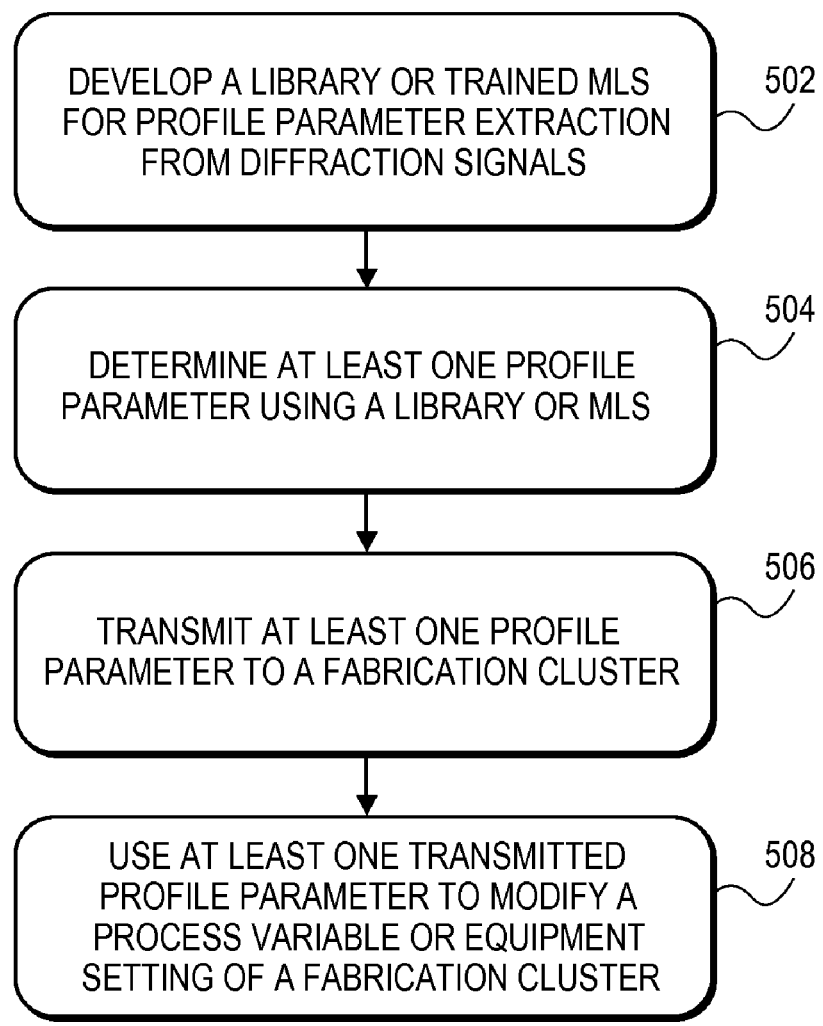
FIG. 5 depicts a flowchart representing an exemplary series of operations for determining and utilizing structural parameters for automated process and equipment control, in accordance with an embodiment of the present invention.

Calculations based simulated diffraction orders may be indicative of profile parameters for a patterned film, such as a patterned semiconductor film or photo-resist layer, and may be used for calibrating automated processes or equipment control. FIG. 5 depicts a flowchart 500 representing an exemplary series of operations for determining and utilizing structural parameters, such as profile parameters, for automated process and equipment control, in accordance with an embodiment of the present invention.

Referring to operation 502 of flowchart 500, a stitched library or trained machine learning systems (MLS) is developed to extract profile parameters from a set of measured diffraction signals. In operation 504, at least one profile parameter of a structure is determined using the stitched library or the trained MLS. In operation 506, the at least one profile parameter is transmitted to a fabrication cluster configured to perform a processing step, where the processing step may be executed in the semiconductor manufacturing process flow either before or after measurement step 504 is made. In operation 508, the at least one transmitted profile parameter is used to modify a process variable or equipment setting for the processing step performed by the fabrication cluster.

For a more detailed description of machine learning systems and algorithms, see U.S. Pat. No. 7,831,528, entitled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety. For a description of diffraction order optimization for two dimensional repeating structures, see U.S. Pat. No. 7,428,060, entitled OPTIMIZATION OF DIFFRACTION ORDER SELECTION FOR TWO-DIMENSIONAL STRUCTURES, filed on Mar. 24, 2006, which is incorporated herein by reference in its entirety. For a description of split machine learning systems, see U.S. Pat. No. 7,421,414, entitled SPLIT MACHINE LEARNING SYSTEMS, filed on Mar. 31, 2005, which is incorporated herein by reference in its entirety.

Figure 6:
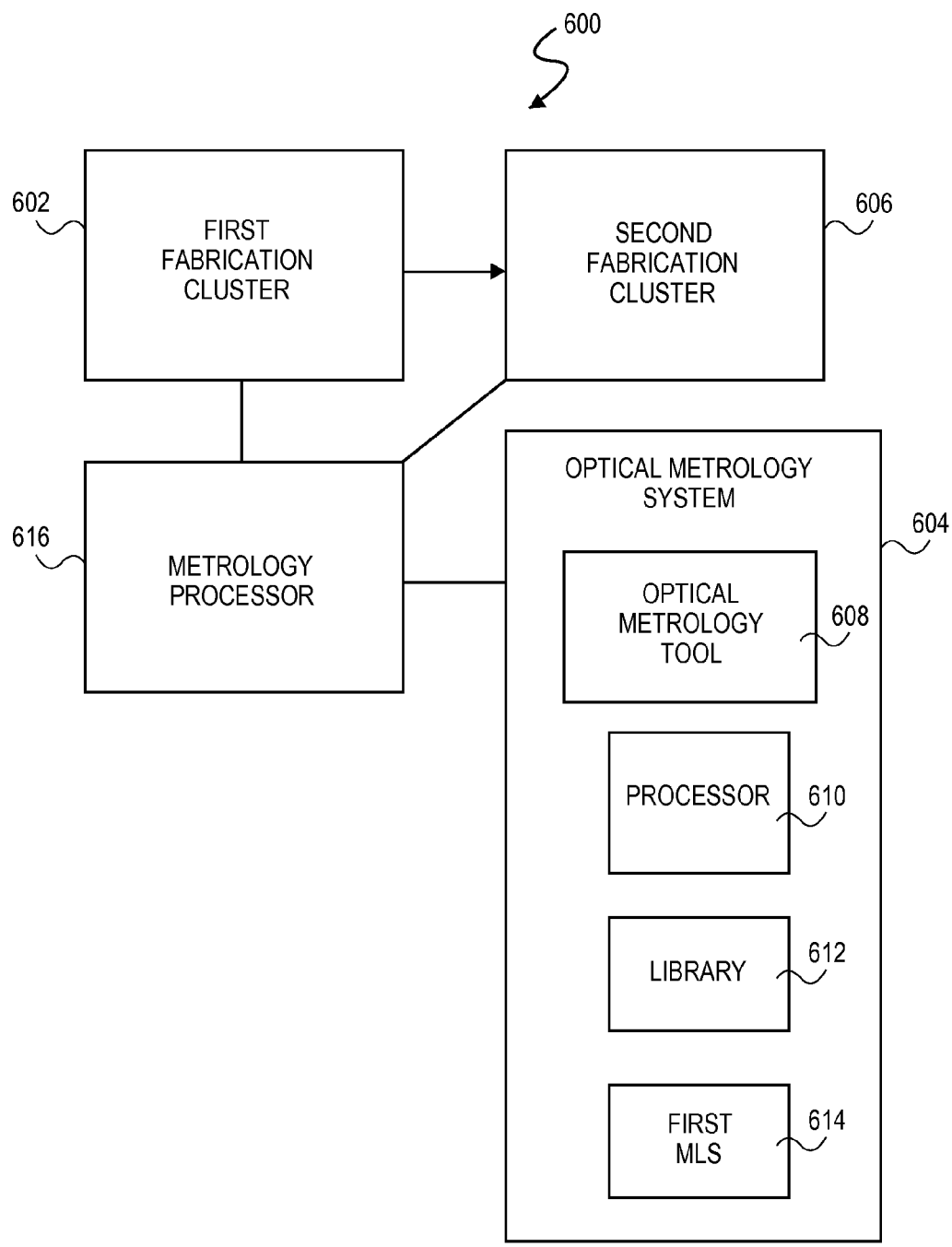
FIG. 6 is an exemplary block diagram of a system for determining and utilizing structural parameters for automated process and equipment control, in accordance with an embodiment of the present invention.

FIG. 6 is an exemplary block diagram of a system 600 for determining and utilizing structural parameters, such as profile parameters, for automated process and equipment control, in accordance with an embodiment of the present invention. System 600 includes a first fabrication cluster 602 and optical metrology system 604. System 600 also includes a second fabrication cluster 606. Although the second fabrication cluster 606 is depicted in FIG. 6 as being subsequent to first fabrication cluster 602, it should be recognized that second fabrication cluster 606 can be located prior to first fabrication cluster 602 in system 600 (and, e.g., in the manufacturing process flow).

A photolithographic process, such as exposing and developing a photo-resist layer applied to a wafer, can be performed using first fabrication cluster 602. In one exemplary embodiment, optical metrology system 604 includes an optical metrology tool 608 and processor 610. Optical metrology tool 608 is configured to measure a diffraction signal obtained from the structure. If the measured diffraction signal and the simulated diffraction signal match, one or more values of the profile parameters are determined to be the one or more values of the profile parameters associated with the simulated diffraction signal.

In one exemplary embodiment, optical metrology system 604 can also include a stitched library 612 with a plurality of simulated diffraction signals and a plurality of values of one or more profile parameters associated with the plurality of simulated diffraction signals. As described above, the stitched library can be generated in advance. Metrology processor 610 can compare a measured diffraction signal obtained from a structure to the plurality of simulated diffraction signals in the stitched library. When a matching simulated diffraction signal is found, the one or more values of the profile parameters associated with the matching simulated diffraction signal in the stitched library is assumed to be the one or more values of the profile parameters used in the wafer application to fabricate the structure.

System 600 also includes a metrology processor 616. In one exemplary embodiment, processor 610 can transmit the one or more values of the one or more profile parameters to metrology processor 616. Metrology processor 616 can then adjust one or more process parameters or equipment settings of first fabrication cluster 602 based on the one or more values of the one or more profile parameters determined using optical metrology system 604. Metrology processor 616 can also adjust one or more process parameters or equipment settings of the second fabrication cluster 606 based on the one or more values of the one or more profile parameters determined using optical metrology system 604. As noted above, fabrication cluster 606 can process the wafer before or after fabrication cluster 602. In another exemplary embodiment, processor 610 is configured to train machine learning system 614 using the set of measured diffraction signals as inputs to machine learning system 614 and profile parameters as the expected outputs of machine learning system 614.

Figure 7:
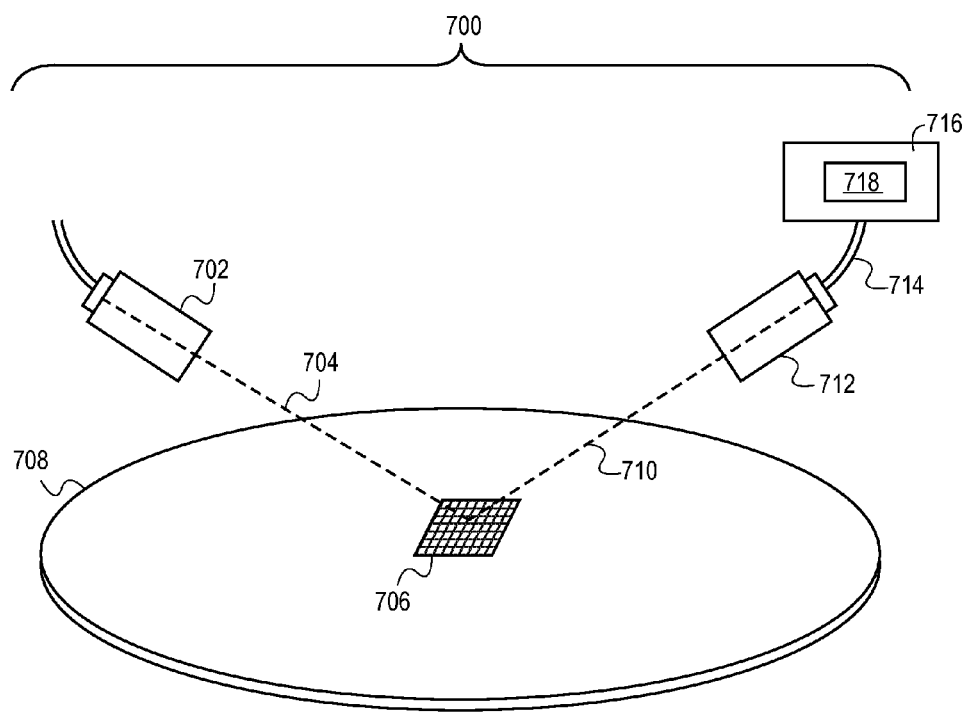
FIG. 7 is an architectural diagram illustrating the utilization of optical metrology to determine the profiles of structures on a semiconductor wafer, in accordance with an embodiment of the present invention.

FIG. 7 is an architectural diagram illustrating the utilization of optical metrology to determine the profiles of structures on a semiconductor wafer, in accordance with embodiments of the present invention. The optical metrology system 700 includes a metrology beam source 702 projecting a metrology beam 704 at the target structure 706 of a wafer 708. The metrology beam 704 is projected at an incidence angle 8 towards the target structure 706. The diffraction beam 710 is measured by a metrology beam receiver 712. The diffraction beam data 714 is transmitted to a profile application server 716. The profile application server 716 compares the measured diffraction beam data 714 against a stitched library 718 of simulated diffraction beam data representing varying combinations of critical dimensions of the target structure and resolution.

In accordance with an embodiment of the present invention, at least a portion of the simulated diffraction beam data is based on a difference determined for two or more azimuth angles. In accordance with another embodiment of the present invention, at least a portion of the simulated diffraction beam data is based on a difference determined for two or more angles of incidence. In one exemplary embodiment, the stitched library 718 instance best matching the measured diffraction beam data 714 is selected. It is to be understood that although a stitched library of diffraction spectra or signals and associated hypothetical profiles is frequently used to illustrate concepts and principles, the present invention applies equally to a stitched data space including simulated diffraction signals and associated sets of profile parameters, such as in regression, neural network, and similar methods used for profile extraction. The hypothetical profile and associated critical dimensions of the selected stitched library 716 instance is assumed to correspond to the actual cross-sectional profile and critical dimensions of the features of the target structure 706. The optical metrology system 700 may utilize a reflectometer, an ellipsometer, or other optical metrology device to measure the diffraction beam or signal.

Embodiments of the present invention may be suitable for a variety of film stacks. For example, in an embodiment, a film stack includes a single layer or multiple layers. Also, in an embodiment, an analyzed or measured grating structure includes both a three-dimensional component and a two-dimensional component. For example, the efficiency of a computation based on simulated diffraction data may be optimized by taking advantage of the simpler contribution by the two-dimensional component to the over all structure and the diffraction data thereof.

In order to facilitate the description of embodiments of the present invention, an ellipsometric optical metrology system is used to illustrate the above concepts and principles. It is to be understood that the same concepts and principles apply equally to the other optical metrology systems, such as reflectometric systems. In a similar manner, a semiconductor wafer may be utilized to illustrate an application of the concept. Again, the methods and processes apply equally to other work pieces that have repeating structures. In an embodiment, the optical scatterometry is a technique such as, but not limited to, optical spectroscopic ellipsometry (SE), beam profile reflectometry (BPR), and enhanced ultra-violet reflectometry (eUVR).

The present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

Figure 8:
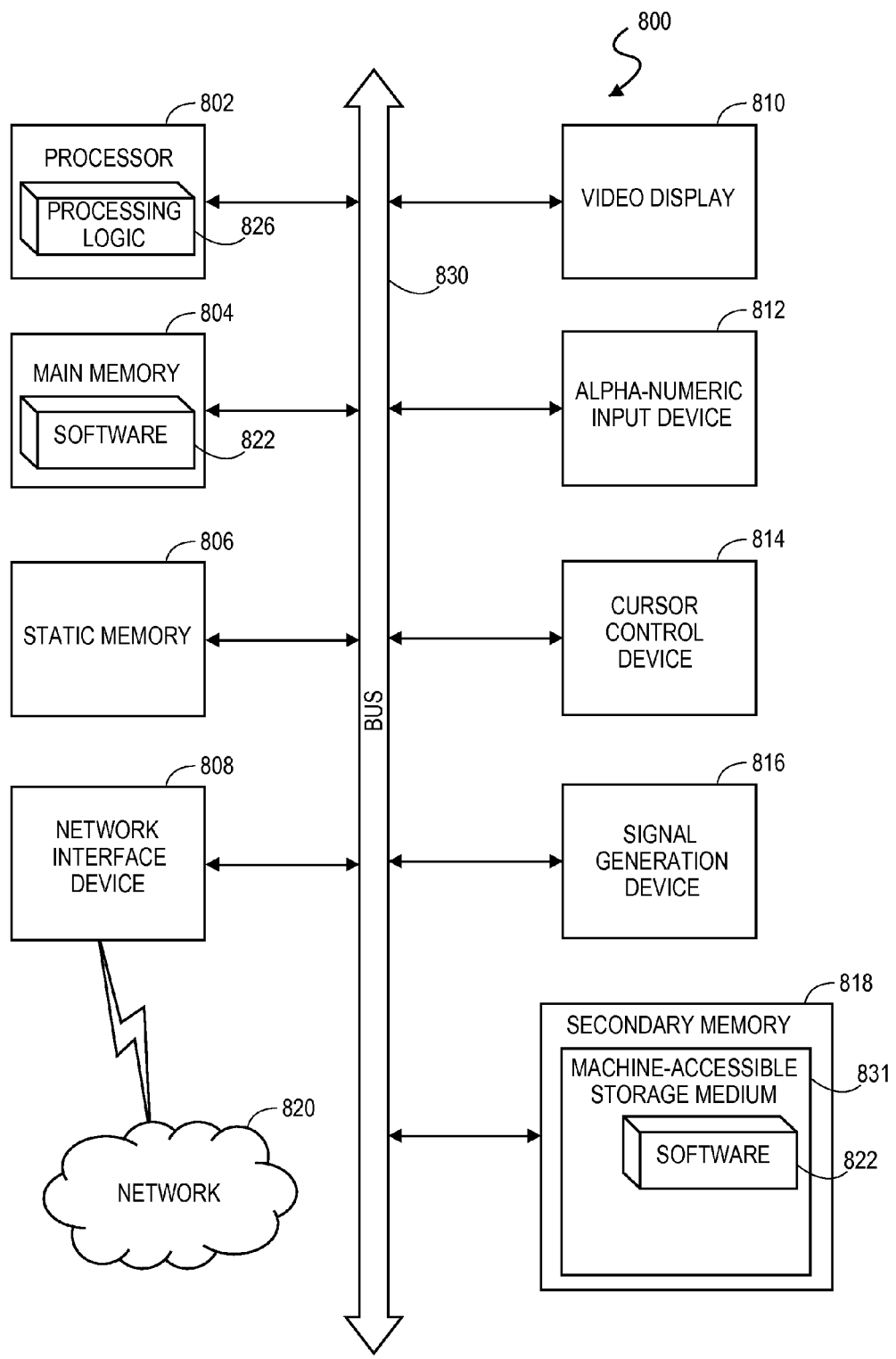
FIG. 8 illustrates a block diagram of an exemplary computer system, in accordance with an embodiment of the present invention.

FIG. 8 illustrates a diagrammatic representation of a machine in the exemplary form of a computer system 800 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations discussed herein.

The computer system 800 may further include a network interface device 808. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 831 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of generating a wide process range library for metrology. The method includes generating a first library having a first process range for a first parameter. A second library is generated, the second library having a second process range for the first parameter. The second process range overlaps with the first process range. The second library is stitched to the first library to generate a third library having a third process range for the first parameter. The third process range is wider than each of the first and second process ranges.

In an embodiment, the first library has one or more sub-libraries, the second library has one or more sub-libraries, and the third library includes all of the sub-libraries of the first and second libraries.

In an embodiment, the first library has one or more additional parameters, the second library also has the one or more additional parameters, and the process ranges for the one or more additional parameters are the same in both the first and second libraries. In one such embodiment, the first and second libraries differ only by the first and second process ranges.

In an embodiment, the first and second libraries overlap by an overlap amount. In one such embodiment, the method further includes determining the overlap amount based on the derivative of a combined function in the region where the second process range is overlapping with the first process range. The determining is also based on a library error estimation for each of the first and second libraries.

In an embodiment, the method further includes generating a fourth library having a fourth process range for the first parameter. The fourth process range overlaps with the third process range. In one such embodiment, the method also includes stitching the fourth library to the third library to generate a fifth library having a fifth process range for the first parameter. The fifth process range is wider than each of the third and fourth process ranges.

In an embodiment, the first library has a fourth process range for a second parameter, the second library has a fifth process range for the second parameter, the fifth process range overlapping with the fourth process range, and the third library has a sixth process range for the second parameter, the sixth process range wider than each of the fourth and fifth process ranges.

In an embodiment, the first parameter is of an individual feature of a two-dimensional or three-dimensional grating structure. In one such embodiment, the first parameter is one such as, but not limited to, width, height, length, top corner rounding, bottom footing, or sidewall angle of the individual feature.

In an embodiment, the third library includes a simulated spectrum. In one such embodiment, the method further includes comparing the simulated spectrum to a sample spectrum.

In accordance with another embodiment of the present invention, a machine-accessible storage medium has instructions stored thereon which cause a data processing system to perform another method of generating a wide process range library for metrology. The method includes generating a first library having a plurality of process ranges. Each process range corresponds to a different one of a plurality of parameters. A second library is generated, the second library having a process range for a first of the plurality of parameters. The process range of the second library is different from, but overlaps with, the process range of the first library for the first of the plurality of parameters. The second library is stitched to the first library. The generating and stitching is then repeated for one or more additional parameters of the plurality of parameters to provide a final library.

In an embodiment, each of the process ranges of the final library is wider than or equal to the corresponding process range of the plurality of process ranges of the first library. In an embodiment, the final library includes a simulated spectrum, and the method further includes comparing the simulated spectrum to a sample spectrum.

Any suitable neural network may be used to perform one or more approaches described in association with flowcharts 100 and 300. As an example, a neural network uses a back-propagation algorithm. The neural network includes an input layer, an output layer, and a hidden layer between the input layer and the output layer. The input layer and the hidden layer are connected using links. The hidden layer and the output layer are connected using the links. It should be recognized, however, that the neural network can include any number of layers connected in various configurations commonly known in the neural network art.

The input layer may include one or more input nodes. In an exemplary implementation, an input node in the input layer corresponds to a profile parameter of the profile model that is inputted into the neural network. Thus, the number of input nodes corresponds to the number of profile parameters used to characterize the profile model. For example, if a profile model is characterized using two profile parameters (e.g., top and bottom critical dimensions), the input layer includes two input nodes, where a first input node corresponds to a first profile parameter (e.g., a top critical dimension) and a second input node corresponds to a second profile parameter (e.g., a bottom critical dimension).

In the neural network, the output layer includes one or more output nodes. In an exemplary implementation, each output node is a linear function. It should be recognized, however, that each output node can be various types of functions. Additionally, in the present exemplary implementation, an output node in the output layer corresponds to a dimension of the simulated diffraction signal that is outputted from the neural network. Thus, the number of output nodes corresponds to the number of dimensions used to characterize the simulated diffraction signal. For example, if a simulated diffraction signal is characterized using five dimensions corresponding to, for example, five different wavelengths, the output layer includes five output nodes, wherein a first output node corresponds to a first dimension (e.g., a first wavelength), a second output node corresponds to a second dimension (e.g., a second wavelength), etc. Additionally, for increased performance, the neural network can be separated into a plurality of sub networks based on separate components of the simulated diffraction signal and/or dimensions of the components of the simulated diffraction signal.

In the neural network, the hidden layer includes one or more hidden nodes. In an exemplary implementation, each hidden node is a sigmoidal transfer function or a radial basis function. It should be recognized, however, that each hidden node can be various types of functions. Additionally, in the present exemplary implementation, the number of hidden nodes is determined based on the number of output nodes. More particularly, the number of hidden nodes (m) is related to the number of output nodes (n) by a predetermined ratio (r=m/n). For example, when r=10, there are 10 hidden nodes for each output node. It should be recognized, however, that the predetermined ratio can be a ratio of the number of output nodes to the number of hidden nodes (i.e., r=n/m). Additionally, it should be recognized that the number of hidden nodes in the neural network can be adjusted after the initial number of hidden nodes is determined based on the predetermined ratio. Furthermore, the number of hidden nodes in the neural network can be determined based on experience and/or experimentation rather than based on the predetermined ratio.

Analysis of measured spectra generally involves comparing the measured sample spectra to simulated spectra to deduce a model's parameter values that best describe the measured sample. For example, in an embodiment, at a first operation, a set of material files are defined by a user to specify characteristics (e.g., n, k values) of the material(s) from which the measured sample feature is formed.

At a second operation, a scatterometry user defines a nominal model of the expected sample structure by selecting one or more of the material files to assemble a stack of materials corresponding to those present in the periodic grating features to be measured. This user-defined model may be further parameterized through definition of nominal values of model parameters, such as thicknesses, CD, SWA, HT, edge roughness, corner rounding radius, etc. which characterize the shape of the feature being measured. Depending on whether a 2D model (i.e., a profile) or 3D model is defined, it is not uncommon to have 30-50, or more, such model parameters.

From a parameterized model, simulated spectra for a given set of grating parameter values may be computed using rigorous diffraction modeling algorithms, such as Rigorous Coupled Wave Analysis (RCWA). Regression analysis is then performed at a third operation until the parameterized model converges on a set of parameter values characterizing a final profile model (for 2D) that corresponds to a simulated spectrum which matches the measured diffraction spectra to a predefined matching criterion. The final profile model associated with the matching simulated diffraction signal is presumed to represent the actual profile of the structure from which the model was generated.

The matching simulated spectra and/or associated optimized profile model can then be utilized at a fourth operation to generate a library of simulated diffraction spectra by perturbing the values of the parameterized final profile model. The resulting library of simulated diffraction spectra may then be employed by a scatterometry measurement system operating in a production environment to determine whether subsequently measured grating structures have been fabricated according to specifications. Library generation may include a machine learning system, such as a neural network, generating simulated spectral information for each of a number of profiles, each profile including a set of one or more modeled profile parameters. In order to generate the library, the machine learning system itself may have to undergo some training based on a training data set of spectral information. Such training may be computationally intensive and/or may have to be repeated for different models and/or profile parameter domains. Considerable inefficiency in the computational load of generating a library may be introduced by a user's decisions regarding the size of a training data set. For example, selection of an overly large training data set may result in unnecessary computations for training while training with a training data set of insufficient size may necessitate a retraining to generate a library.

Some embodiments described herein include an automated determination of a training data set size to be used in training a machine learning system. Generally, the training data set is sized based on convergence of a data set characterization metric and may be further based on an estimate of the final solution error. The training data set is incrementally expanded and tested to identify convergence and, in certain embodiments, estimate the final solution error such a sample size will provide. The incremental expansion and testing is performed until a convergence criteria is met and/or the estimate of final solution error meets a threshold.

Because the training matrix sizing methods described herein may not require a separate training, a good training data sample set for neural network training is identified quickly, efficiently, and with good control of the final solution error. With the training data sample set identified, a machine learning system may then be trained to generate the desired target function information. In one particular embodiment, the machine learning system is trained to generate a library of simulated spectral information (e.g., diffraction signals) which may be utilized to deduce parameters of an unknown sample (e.g., diffraction grating or a wafer periodic structure) measured with a scatterometry system.

It is to be understood that the above methodologies may be applied under a variety of circumstances within the spirit and scope of embodiments of the present invention. For example, in an embodiment, a method described above is performed in a semiconductor, solar, light-emitting diode (LED), or a related fabrication process. In an embodiment, a method described above is used in a stand-alone or an integrated metrology tool. In an embodiment, a method described above is used in single- or multiple-measurement target regressions.

Thus, methods of generating wide process range libraries for metrology have been disclosed. In accordance with an embodiment of the present invention, a method includes generating a first library having a first process range for a first parameter. A second library is generated having a second process range for the first parameter. The second process range is overlapping with the first process range. The second library is stitched to the first library to generate a third library having a third process range for the first parameter. The third process range is wider than each of the first and second process ranges.

What is claimed is:

1. A method of generating a wide process range library for metrology of repeating structures on a semiconductor substrate or wafer, the method comprising:

generating, using a computer, a first library having a first process range for a first parameter;

generating a second library having a second process range for the first parameter, the second process range overlapping with the first process range;

stitching the second library to the first library to generate a third library having a third process range for the first parameter, the third process range wider than each of the first and second process ranges, the stitching comprising determining an overlap amount of the first and second process ranges based on a derivative of a combined function in a region where the second process range is overlapping with the first process range; and providing a simulated spectrum from the third library.

2. The method of claim 1, wherein the first library has one or more sub-libraries, the second library has one or more sub-libraries, and the third library includes all of the sub-libraries of the first and second libraries.

3. The method of claim 1, wherein the first library has one or more additional parameters, the second library also has the one or more additional parameters, and the process ranges for the one or more additional parameters are the same in both the first and second libraries.

4. The method of claim 3, wherein the first and second libraries differ only by the first and second process ranges.

5. The method of claim 1, wherein the stitching further comprises determining a library error estimation for each of the first and second libraries.

6. The method of claim 1, the method further comprising:
generating a fourth library having a fourth process range for the first parameter, the fourth process range overlapping with the third process range; and
stitching the fourth library to the third library to generate a fifth library having a fifth process range for the first parameter, the fifth process range wider than each of the third and fourth process ranges.

7. The method of claim 1, wherein the first library has a fourth process range for a second parameter, the second library has a fifth process range for the second parameter, the fifth process range overlapping with the fourth process range, and the third library has a sixth process range for the second parameter, the sixth process range wider than each of the fourth and fifth process ranges.

8. The method of claim 1, wherein the first parameter is of an individual feature of a two-dimensional or three-dimensional grating structure.

9. The method of claim 8, wherein the first parameter is selected from the group consisting of width, height, length, top corner rounding, bottom footing, and sidewall angle of the individual feature.

10. The method of claim 1, further comprising:
comparing the simulated spectrum to a sample spectrum.

11. A method of generating a wide process range library for metrology of repeating structures on a semiconductor substrate or wafer, the method comprising:
generating, using a computer, a first library having a plurality of process ranges, each process range corresponding to a different one of a plurality of parameters;
generating a second library having a process range for a first of the plurality of parameters, the process range of the second library different from but overlapping with the process range of the first library for the first of the plurality of parameters;
stitching the second library to the first library, the stitching comprising determining an overlap amount of the first and second process ranges based on a derivative of a combined function in a region where the second process range is overlapping with the first process range;
repeating the generating and stitching for one or more additional parameters of the plurality of parameters to provide a final library; and
providing a simulated spectrum from the final library.

12. The method of claim 11, wherein each of the process ranges of the final library is wider than or equal to the corresponding process range of the plurality of process ranges of the first library.

13. The method of claim 11, further comprising:
comparing the simulated spectrum to a sample spectrum.

14. A non-transitory machine-accessible storage medium having instructions stored thereon which cause a data processing system to perform a method of generating a wide process range library for metrology of repeating structures on a semiconductor substrate or wafer, the method comprising:
generating a first library having a first process range for a first parameter;
generating a second library having a second process range for the first parameter, the second process range overlapping with the first process range; and
stitching the second library to the first library to generate a third library having a third process range for the first parameter, the third process range wider than each of the first and second process ranges, the stitching comprising determining an overlap amount of the first and second process ranges based on a derivative of a combined function in a region where the second process range is overlapping with the first process range.

15. The non-transitory storage medium as in claim 14, wherein the first library has one or more sub-libraries, the second library has one or more sub-libraries, and the third library includes all of the sub-libraries of the first and second libraries.

16. The non-transitory storage medium as in claim 14, wherein the first library has one or more additional parameters, the second library also has the one or more additional parameters, and the process ranges for the one or more additional parameters are the same in both the first and second libraries.

17. The non-transitory storage medium as in claim 16, wherein the first and second libraries differ only by the first and second process ranges.

18. The non-transitory storage medium as in claim 14, wherein the stitching further comprises determining a library error estimation for each of the first and second libraries.

19. The non-transitory storage medium as in claim 14, the method further comprising:
generating a fourth library having a fourth process range for the first parameter, the fourth process range overlapping with the third process range; and
stitching the fourth library to the third library to generate a fifth library having a fifth process range for the first parameter, the fifth process range wider than each of the third and fourth process ranges.

20. The non-transitory storage medium as in claim 14, wherein the first library has a fourth process range for a second parameter, the second library has a fifth process range for the second parameter, the fifth process range overlapping with the fourth process range, and the third library has a sixth process range for the second parameter, the sixth process range wider than each of the fourth and fifth process ranges.

21. The non-transitory storage medium as in claim 14, wherein the first parameter is of an individual feature of a two-dimensional or three-dimensional grating structure.

22. The non-transitory storage medium as in claim 21, wherein the first parameter is selected from the group consisting of width, height, length, top corner rounding, bottom footing, and sidewall angle of the individual feature.

23. The non-transitory storage medium as in claim 14, wherein the third library comprises a simulated spectrum, the method further comprising:
comparing the simulated spectrum to a sample spectrum.

24. A non-transitory machine-accessible storage medium having instructions stored thereon which cause a data processing system to perform a method of generating a wide process range library for metrology of repeating structures on a semiconductor substrate or wafer, the method comprising:

generating a first library having a plurality of process ranges, each process range corresponding to a different one of a plurality of parameters;

generating a second library having a process range for a first of the plurality of parameters, the process range of the second library different from but overlapping with the process range of the first library for the first of the plurality of parameters;

stitching the second library to the first library, the stitching comprising determining an overlap amount of the first and second process ranges based on a derivative of a combined function in a region where the second process range is overlapping with the first process range; and repeating the generating and stitching for one or more additional parameters of the plurality of parameters to provide a final library.

25. The non-transitory storage medium as in claim 24, wherein each of the process ranges of the final library is wider than or equal to the corresponding process range of the plurality of process ranges of the first library.

26. The non-transitory storage medium as in claim 24, wherein the final library comprises a simulated spectrum, the method further comprising:

comparing the simulated spectrum to a sample spectrum.

* * * * *